United States Patent
Mayer Pujadas et al.

(10) Patent No.: US 10,174,427 B2
(45) Date of Patent: Jan. 8, 2019

(54) METHOD FOR TREATMENT OF SURFACES

(71) Applicant: Zanini Auto Grup, S.A., Parets del Valles, (Barcelona) (ES)

(72) Inventors: Augusto Mayer Pujadas, Parets del Valles (ES); José Sanahuja Clot, Parets del Valles (ES)

(73) Assignee: ZANINI AUTO GRUP, S.A., Parets del Valles (Barcelona) (ES)

( * ) Notice: Subject to any disclaimer, the term of this patent is extended or adjusted under 35 U.S.C. 154(b) by 0 days.

(21) Appl. No.: 15/543,400

(22) PCT Filed: Jan. 13, 2016

(86) PCT No.: PCT/ES2016/070010
§ 371 (c)(1),
(2) Date: Jul. 13, 2017

(87) PCT Pub. No.: WO2016/113451
PCT Pub. Date: Jul. 21, 2016

(65) Prior Publication Data
US 2017/0370008 A1    Dec. 28, 2017

(30) Foreign Application Priority Data
Jan. 13, 2015 (EP) .................................... 15382003

(51) Int. Cl.
| C23F 1/02 | (2006.01) |
|---|---|
| B23K 26/36 | (2014.01) |
| B44C 1/22 | (2006.01) |
| C25D 5/48 | (2006.01) |
| C25D 5/56 | (2006.01) |
| B23K 26/362 | (2014.01) |
| C23F 17/00 | (2006.01) |
| C25D 3/04 | (2006.01) |
| C25D 5/14 | (2006.01) |
| C23C 14/02 | (2006.01) |
| C23C 14/04 | (2006.01) |
| C23C 14/14 | (2006.01) |
| C23C 28/02 | (2006.01) |

(52) U.S. Cl.
CPC ................ *C23F 1/02* (2013.01); *B23K 26/36* (2013.01); *B23K 26/362* (2013.01); *B44C 1/22* (2013.01); *C23C 14/025* (2013.01); *C23C 14/042* (2013.01); *C23C 14/14* (2013.01); *C23C 28/023* (2013.01); *C23F 17/00* (2013.01); *C25D 3/04* (2013.01); *C25D 5/14* (2013.01); *C25D 5/48* (2013.01); *C25D 5/56* (2013.01)

(58) Field of Classification Search
CPC .......... C23F 1/02; C23F 17/00; C23C 28/023; C23C 14/042; C23C 14/025; C23C 14/14; C25D 5/14; C25D 3/04; C25D 5/56; C25D 5/48; B23K 26/362; B23K 26/36; B44C 1/22
See application file for complete search history.

(56) References Cited

U.S. PATENT DOCUMENTS

| 2002/0197492 A1* | 12/2002 | Hao | C25D 5/022 |
|---|---|---|---|
| | | | 428/457 |
| 2006/0086620 A1 | 4/2006 | Chase et al. | |
| 2013/0323433 A1 | 12/2013 | Lee | |

FOREIGN PATENT DOCUMENTS

| JP | H08283962 A | 10/1996 |
|---|---|---|
| WO | 2011/023798 A1 | 3/2011 |

OTHER PUBLICATIONS

International Search Report issued by the European Patent Office dated Feb. 24, 2016 in connection with International Application No. PCT/ES2016/070010.
Extended European Search Report, in connection with European Patent Application No. 16737111.1, dated Aug. 1, 2018.

* cited by examiner

*Primary Examiner* — Nadine G Norton
*Assistant Examiner* — Mahmoud Dahimene
(74) *Attorney, Agent, or Firm* — Gary J. Gershik; Cooper & Dunham LLP

(57) ABSTRACT

The method for treatment of parts, characterized in that it comprises the stages of applying an electrolytic chromium plating layer on a part; applying a coating over the entire outer surface of the part; selective stripping of the coating in order to leave the part with at least one coated portion and at least one uncoated portion; carrying out a selective etching on the layer in at least one part of the uncoated portion; metallization of the entire surface of the part; and removal of the coating.

10 Claims, No Drawings

METHOD FOR TREATMENT OF SURFACES

CROSS-REFERENCE TO RELATED APPLICATIONS

This application is a § 371 national stage of PCT International Application No. PCT/ES2016/070010, filed Jan. 13, 2016, claiming priority of European Patent Application EP15392003.0, filed Jan. 13, 2015, the contents of each of which are hereby incorporated by reference into this application.

FIELD OF THE INVENTION

The present invention relates to a method for treatment of parts that enables combining different finishes in one same part, finishes such as gloss, satin, textures and different colors.

Background of the Invention

Currently, chromium coatings by electrolytic baths are used as a decorative layer protecting against corrosion. Generally, these coatings are carried out with electrolytic baths.

In these conventional baths, plastics are not conductors, so they need to be subjected to complex pre-treatment processes in order to receive the coatings.

Currently, new methods for chromium plating by means of physical vapor deposition (PVD) are being developed, which enable using less toxic products. PVD technology starts directly with the solid material that is to be deposited, and then converted into vapor by means of healing or bombarding it with energetic ions. The produced vapor condenses on the surface of the substrate, forming a thin layer. The process is carried out in a vacuum or in a controlled atmosphere in order to prevent the interaction of the metallic vapor with the air. A coating process by means of this method is described in the application of patent ES 2239 907 A1.

In order to create chromium plating, either on plastic or on metal surfaces, copper is first deposited on the surface of the product. This layer is about 20 to 25 microns thick. A nickel deposition of about 15 microns is then carried out and finally the chromium is applied with a typical thickness of 0.5 microns. In the case of wanting to confer a matte appearance, the last layer of nickel is tinted before applying the chromium. However, if the part is to have matte areas and shiny areas, the area or areas with a different appearance from that of most of the part should be inserted independently, giving rise to additional complexity. Currently, matte areas can be achieved with the partial application of organic layers on the shiny chromium-plated surface. This solution has problems of definition at the border of the different finishes and of resistance with respect to outdoor demands required in automotive applications such as adherence, scratches resistance, etc.

In order to solve these inconveniences, the applicant of the present application designed the method that is described in patent application WO2011023798.

The method described in this document allows combining certain finishes in a single part, such as shiny and matte, but it does not allow obtaining other types of finishes.

Therefore, the objective of the present invention is to provide a method for treatment of parts that allows obtaining and combining more finishes than the previously described methods.

DESCRIPTION OF THE INVENTION

The method for treatment of parts of the invention solves the mentioned drawbacks and has other advantages, which are described below.

The method for treatment of parts according to the present invention is characterized in that it comprises the stages of:
  applying an electrolytic chromium plating layer on a part;
  applying a coating over the entire outer surface of the part;
  selective stripping of the coating in order to leave the part with at least one coated portion and at least one uncoated portion;
  carrying out a selective etching on the layer in at least one par of the uncoated portion;
  metallization of the entire surface of the part with another color; and
  removal of the rest of the coating.

According to a preferred embodiment, said coating is a paint that can comprise a non-reactive polyurethane; a dark, solid pigment and a thinner.

Advantageously, said selective stripping and said selective etching are carried out by means of a laser.

Furthermore, said metallization is preferably carried out by means of physical vapor deposition.

If desired, said metallization can be carried out by combining a plurality of metals, for example, in order to improve the anti-corrosive properties.

For example, removal of the coating can be carried out by means of ultrasonic baths with isopropyl alcohol as cleaning medium.

Furthermore, the method for treatment of parts according to the present invention can comprise a stage for cleaning the part after the selective etching and prior to metallization.

With the method according to the present invention, it is possible to obtain a final appearance of the part with differentiated finishes such as gloss, satin, texture and several colors.

DESCRIPTION OF A PREFERRED EMBODIMENT

For the purpose of helping to make the foregoing description more readily understandable, it is accompanied by a description of an embodiment by way of non-limiting example of the method according to the present invention.

The method starts with the application of a first layer of conventional electrolytic chromium plating on a part, preferably made of plastic material. This application is carried out in particular over the entire outer surface of the part.

According to a preferred embodiment, this layer of metal can comprise a first sublayer of copper, a second sublayer of nickel and a third sublayer of chromium.

Then, a coating, for example black paint, is applied over the entire outer surface of the part, this coating being used as a masking.

According to a preferred embodiment, said paint has the following composition, although it could have other suitable compositions;
  50% by weight of Desmolac® 4340X/iB, which is a non-reactive polyurethane by Bayer®;
  10% by weight of Adisolvent Negro 1, P.Black7, which is a black pigment base based on carbon black by Grupo ADI®;
  40% by weight of Thinner A-2005, which is a formulation of solvents based on xylene, butyl acetate and n-butanol.

This formulation was chosen in order to obtain a good balance between the adherence to the substrate and the subsequent capacity to be stripped (in non-aggressive conditions for the material). However, it is clear that said formulation could be varied, as long as this balance is achieved.

Then, a selective stripping of the coating is carried out, exposing the chromium plating in certain selected areas of the part. The coating can be removed by means of lasers, for example, by means of a 1064 nm Nd-YAG laser.

At the end of this stripping stage, a partially painted (if paint is used as coating) and a partially chromed part are obtained.

A selective etching is then earned out on at least some of the areas that have remained devoid of coating.

This selective etching may be textured by means of a laser, reproducing the texture by removing the previously mentioned metal layer, for example by removing the chromium and nickel sublayers.

If desired, a general cleaning of the part can be carried out subsequently, depending on the aggressiveness of the selective etching and the degree of soiling of the part.

Then the metallization of the part is carried out, for example by means of physical vapor deposition (PVD), which enables carrying out different finishes obtaining metallic colors. This metallization is carried out over the entire outer surface of the part.

The metallization can be carried out with different metals, such as Cr, Zr, Mo, Al, Ti, etc., and the combination of this deposition metallization process of these layers and the gasses inside a vacuum chamber enables reactions to occur in order to obtain colors that can be developed with one or more nanometric layers of metals.

Finally, the remaining costing or paint that was used as a mask is removed.

This removal can be carried out by means of ultrasonic baths with isopropyl alcohol although it could be carried out in another similar manner and/or with other suitable solvents or cleaning solutions.

After removing the coating, a part with different finishes is obtained, such as gloss, satin, matte, textures and multiple colors.

Although reference has been made to a specific embodiment of the invention, it is apparent to the person skilled in the art that numerous variations and modifications can be made to the method described, and that all the aforementioned details may be substituted by other technically equivalent ones, without detracting from the scope of protection defined by the attached claims.

What is claimed is:

1. A method for treatment of parts, characterized in that it comprises the stages of:
    applying an electrolytic chromium plating layer on a part;
    applying a coating over the entire outer surface of the part;
    selective stripping of the coating in order to leave the part with at least one coated portion and at least one uncoated portion;
    carrying out a selective etching on the layer in at least one part of the uncoated portion;
    metallization of the entire surface of the part; and
    removal of the rest of the coating.

2. The method for treatment of parts according to claim 1, wherein the layer comprises a first sublayer of copper, a second sublayer of nickel and a third sublayer of chromium.

3. The method for treatment of parts a according to claim 1, wherein said coating is a paint.

4. The method for treatment of parts according to claim 3, wherein said paint comprises a non-reactive polyurethane; a solid, dark pigment and a thinner.

5. The method for treatment of parts according to claim 1, wherein said selective stripping is carried out by means of a laser.

6. The method for treatment of parts according to claim 1, wherein said metallization is carried out by means of physical vapor deposition.

7. The method for treatment of parts according to claim 1, wherein said metallization is carried out by combining a plurality of metals.

8. The method for treatment of parts according to claim 1, wherein the removal of the coating is carried out by means of ultrasonic baths with isopropyl alcohol.

9. The method for treatment of parts according to claim 1, which comprises a stage for cleaning the part after the selective etching and prior to metallization.

10. The method for treatment of parts according to claim 1, wherein said piece is made of plastic material.

* * * * *